(12) United States Patent
Liu et al.

(10) Patent No.: US 8,270,180 B2
(45) Date of Patent: Sep. 18, 2012

(54) PRINTED CIRCUIT BOARD

(75) Inventors: Chien-Hung Liu, Taipei Hsien (TW);
Shou-Kuo Hsu, Taipei Hsien (TW);
Yu-Chang Pai, Taipei Hsien (TW);
Po-Chuan Hsieh, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 361 days.

(21) Appl. No.: 12/646,888

(22) Filed: Dec. 23, 2009

(65) Prior Publication Data

US 2011/0094786 A1 Apr. 28, 2011

(30) Foreign Application Priority Data

Oct. 27, 2009 (CN) .......................... 2009 1 0308915

(51) Int. Cl.
*H05K 1/11* (2006.01)
*H05K 7/00* (2006.01)
*H05K 1/14* (2006.01)

(52) U.S. Cl. ........ 361/794; 174/262; 361/780; 361/792; 361/793; 361/795

(58) Field of Classification Search .......... 174/262–266; 361/792–795, 780
See application file for complete search history.

(56) References Cited

U.S. PATENT DOCUMENTS

| 6,602,078 | B2 * | 8/2003 | Kwark | 439/66 |
| 2002/0139579 | A1 * | 10/2002 | Kwark | 174/262 |
| 2008/0308313 | A1 * | 12/2008 | Gorcea | 174/262 |

* cited by examiner

*Primary Examiner* — Timothy Thompson
*Assistant Examiner* — Sherman Ng
(74) *Attorney, Agent, or Firm* — Altis Law Group, Inc.

(57) ABSTRACT

A printed circuit board includes a number of signal layers, a number of ground layers, a first transmission line, a second transmission line, a first via, and a second via. The first transmission is located on one of the number of signal layers. The second transmission line is located on another of the number of signal layers. The first and second vias pass through the printed circuit board. The first via is electrically coupled to the first and second transmission lines, and is isolated from the number of ground layers. The second via is electrically coupled to one or more of the number of ground layers, and is isolated from the other of the number of ground layers to increase an inductance, thus compensating capacitive nature of an open stub and improving signal integrity.

3 Claims, 4 Drawing Sheets

PRINTED CIRCUIT BOARD

BACKGROUND

1. Technical Field

The present disclosure relates to printed circuit boards.

2. Description of Related Art

Multilayer printed circuit boards (PCBs) are commonly used in electronic devices to connect electronic components such as integrated circuits to one another. Signals between different layers are transmitted through vias connecting transmission lines across different layers. However, only portions of the vias are used for transmitting signals, leaving other portions of the vias as stubs which can cause signal reflection thus degrading performance of the PCBs.

DETAILED DESCRIPTION

Figure 1:
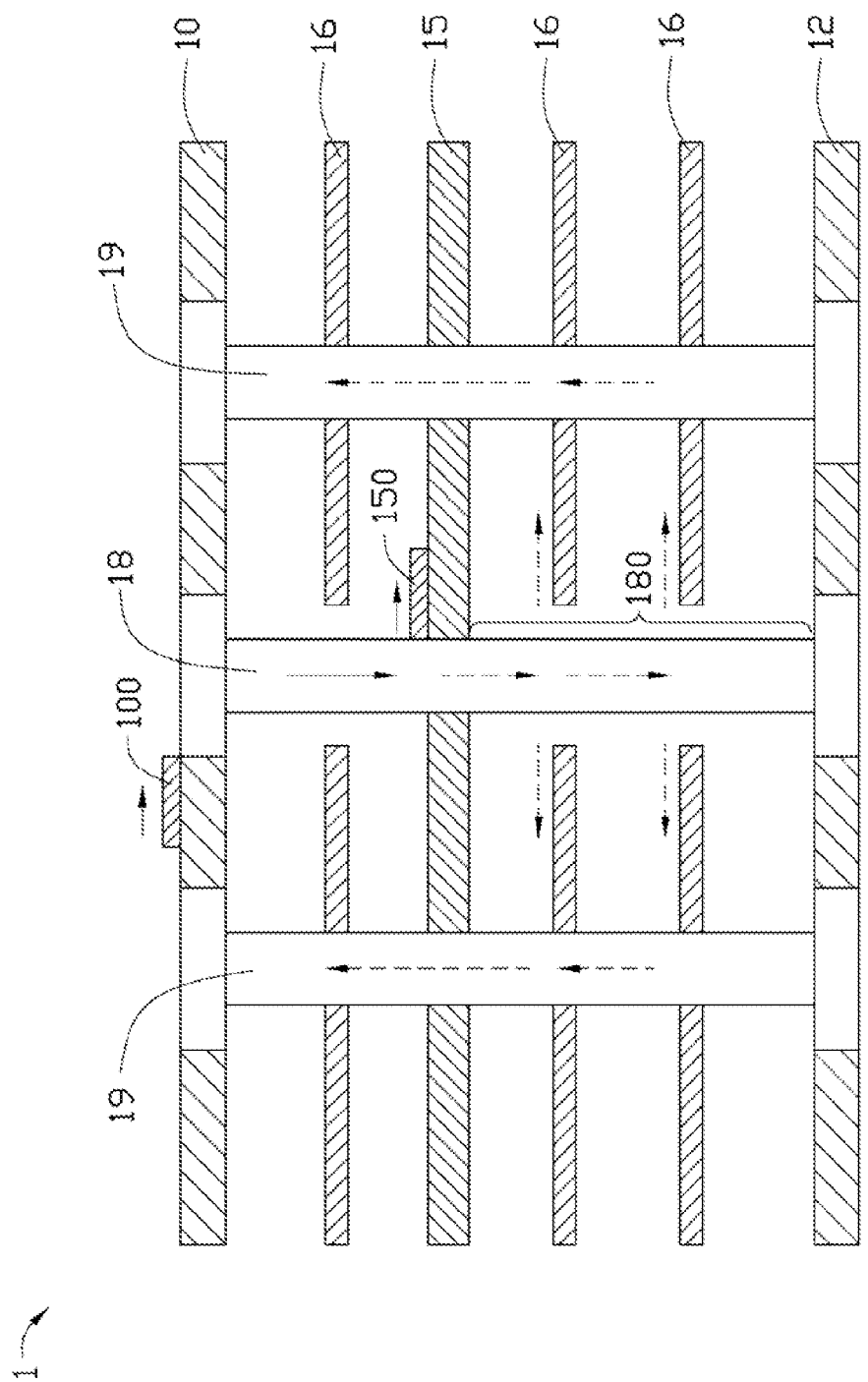
FIG. 1 is a schematic diagram of a first exemplary embodiment of a printed circuit board.

Referring to FIG. 1, a first exemplary embodiment of a printed circuit board 1 is a multi-layered circuit board such as a high-speed digital circuit board, for forming a high-speed signal transmission circuit on the high-speed digital circuit board. The printed circuit board 1 includes a first signal layer 10, a second signal layer 12, a third signal layer 15, a plurality of ground layers 16, a first via 18, and two second vias 19. A transmission line 100 is located on the first signal layer 10, and a transmission line 150 is located on the third signal layer 15.

The first signal layer 10 is on the top of the printed circuit board 1. The second signal layer 12 is on the bottom of the printed circuit board 1. The plurality of ground layers 16 are located between the first signal layer 10 and the second signal layer 12. The third signal layer 15 is located between two of the plurality of ground layers 16.

The first via 18 passes through the printed circuit board 1, and is electrically coupled to the transmission lines 100 and 150, but is isolated from the plurality of ground layers 16. A first terminal of the transmission line 100 is connected to a first electronic element (not shown). A second terminal of the transmission line 100 is connected to the first via 18. A first terminal of the transmission line 150 is connected to the first via 18. A second terminal of the transmission line 150 is connected to a second electronic element (not shown). The first via 18 transmits signals from the transmission line 100 to the transmission line 150.

The two second vias 19 pass through the printed circuit board 1, and are located on different sides of the first via 18. The two second vias 19 are electrically coupled to the plurality of ground layers 16.

When the first via 18 transmits signals from the transmission line 100 to the transmission line 150, a part of the first via 18 between the second signal layer 12 and the third signal layer 15 forms an open stub 180. Signals on the open stub 180 are transmitted to the ground layers 16 which are located on two sides of the first via 18, and then are transmitted back through the two second vias 19 to form a loop (as broken lines shown in FIG. 1). Thus signal reflection from the open stub 180 to the transmission line 150 is prevented. In FIG. 1, solid lines show signals transmitting from the transmission line 100 to the transmission line 150.

Figure 2:
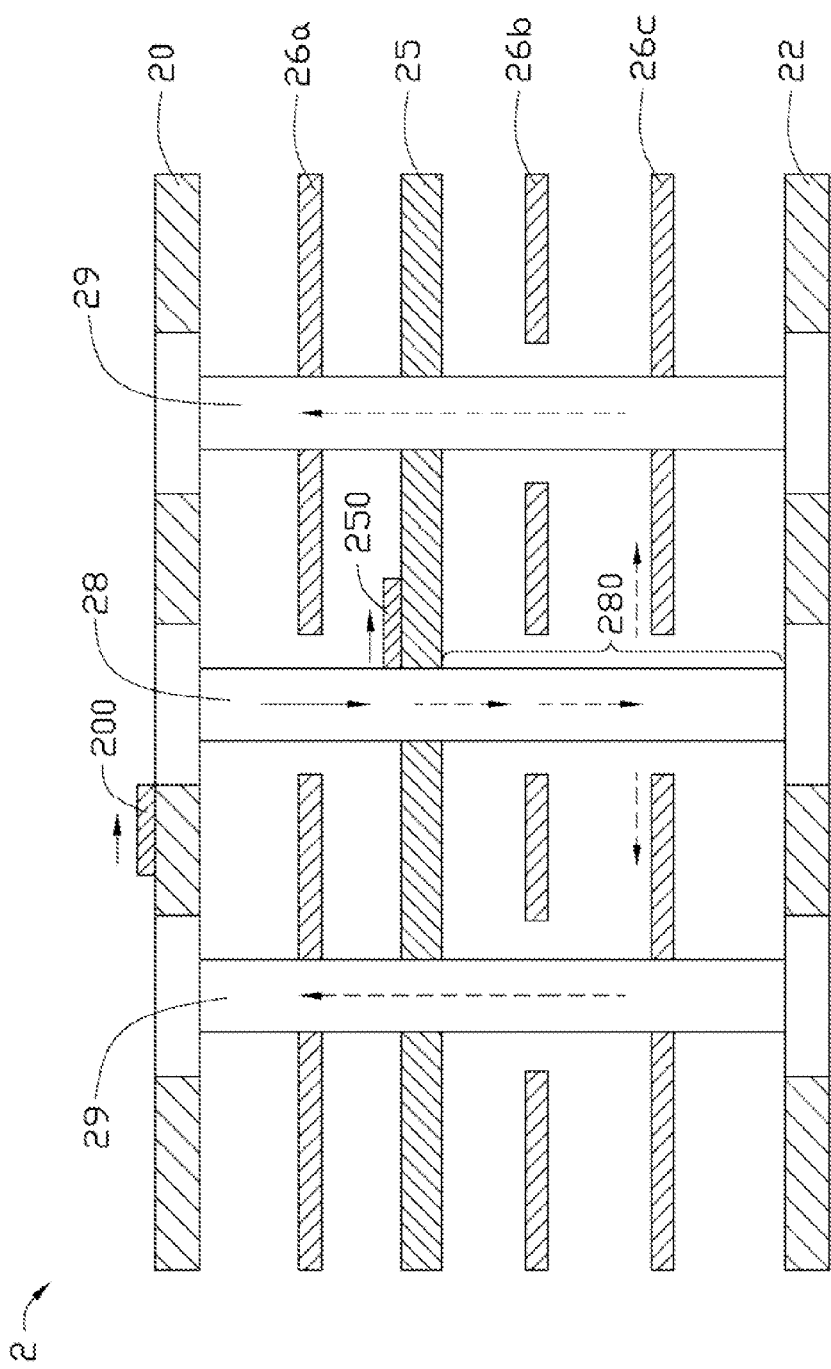
FIG. 2 is a schematic diagram of a second exemplary embodiment of a printed circuit board.

Referring to FIG. 2, a second exemplary embodiment of a printed circuit board 2 includes a first signal layer 20, a second signal layer 22, a third signal layer 25, a first ground layer 26a, a second ground layer 26b, a third ground layer 26c, a first via 28, and two second vias 29. A transmission line 200 is located on the first signal layer 20. A transmission line 250 is located on the third signal layer 25.

The first signal layer 20 is on the top of the printed circuit board 2. The second signal layer 22 is on the bottom of the printed circuit board 2. The first, second, and third ground layers 26a, 26b, and 26c are located between the first signal layer 20 and the second signal layer 22. The third signal layer 25 is located between the first ground layer 26a and the second ground layer 26b.

The first via 28 passes through the printed circuit board 2, and is electrically coupled to the transmission lines 200 and 250, but is isolated from the three ground layers 26a, 26b, and 26c. A first terminal of the transmission line 200 is connected to a first electronic element. A second terminal of the transmission line 200 is connected to the first via 28. A first terminal of the transmission line 250 is connected to the first via 28. A second terminal of the transmission line 250 is connected to a second electronic element. The first via 28 transmits signals from the transmission line 200 to the transmission line 250.

The two second vias 29 pass through the printed circuit board 2, and are located on different sides of the first via 28. The two second vias 29 are electrically coupled to the first ground layer 26a and the third ground layer 26c, but are isolated from the second ground layer 26b.

When the first via 28 transmits signals from the transmission line 200 to the transmission line 250, a part of the first via 28 between the second signal layer 22 and the third signal layer 25 forms an open stub 280. Signals on the open stub 280 are transmitted to the third ground layer 26c which is located between the second ground layer 26b and the second signal layer 22, and then are transmitted back through the two second vias 29 to form a loop (shown as broken lines shown in FIG. 2). Thus, signal reflection from the open stub 280 to the transmission line 250 is prevented. In addition, the second vias 29 are isolated from the second ground layer 26b to increase an inductance, thus compensating capacitive nature of the open stub 280 and improving signal integrity if needed. In FIG. 2, solid lines show signals transmitting from the transmission line 200 to the transmission line 250.

Figure 3:
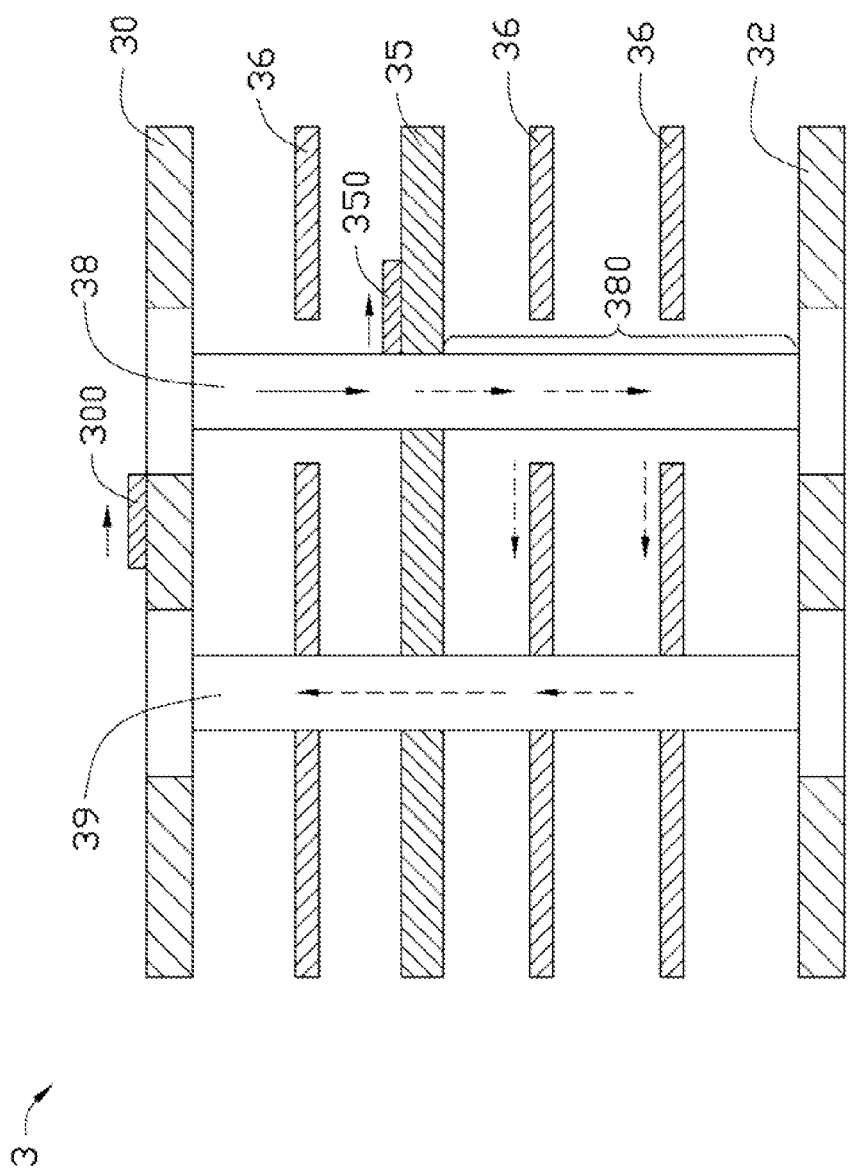
FIG. 3 is a schematic diagram of a third exemplary embodiment of a printed circuit board.

Referring to FIG. 3, a third exemplary embodiment of a printed circuit board 3 includes a first signal layer 30, a second signal layer 32, a third signal layer 35, a plurality of ground layers 36, a first via 38, and a second via 39. A transmission line 300 is located on the first signal layer 30. A transmission line 350 is located on the third signal layer 35.

The first signal layer 30 is on the top of the printed circuit board 3. The second signal layer 32 is on the bottom of the printed circuit board 3. The plurality of ground layers 36 are located between the first signal layer 30 and the second signal layer 32. The third signal layer 35 is located between two of the plurality of ground layers 36.

The first via 38 passes through the printed circuit board 1, and is electrically coupled to the transmission lines 300 and 350, but is isolated from the plurality of ground layers 36. A first terminal of the transmission line 300 is connected to a first electronic element. A second terminal of the transmission line 300 is connected to the first via 38. A first terminal of the transmission line 350 is connected to the first via 38. A second terminal of the transmission line 350 is connected to a second electronic element. The first via 38 transmits signals from the transmission line 300 to the transmission line 350.

The second via 39 passes through the printed circuit board 3, and are located on a side of the first via 38. The second via 19 is electrically coupled to the plurality of ground layers 16.

When the first via 38 transmits signals from the transmission line 300 to the transmission line 350, a part of the first via 38 between the second signal layer 32 and the third signal layer 35 forms an open stub 380. Signals on the open stub 380 are transmitted to the ground layer 36, and then are transmitted back through the second via 39 to form a loop (shown as broken lines shown in FIG. 3). Thus, signal reflection from the open stub 380 to the transmission line 350 is prevented. In FIG. 3, solid lines show signals transmitting from the transmission line 300 to the transmission line 350.

In addition, in other embodiments, the second via 39 may be isolated from the ground layer 36 which is located between the second signal layer 32 and the third signal layer 35, and adjacent to the third signal layer 35. Similar to the second embodiment, signal reflection from the open stub 380 to the transmission line 350 is prevented.

Figure 4:
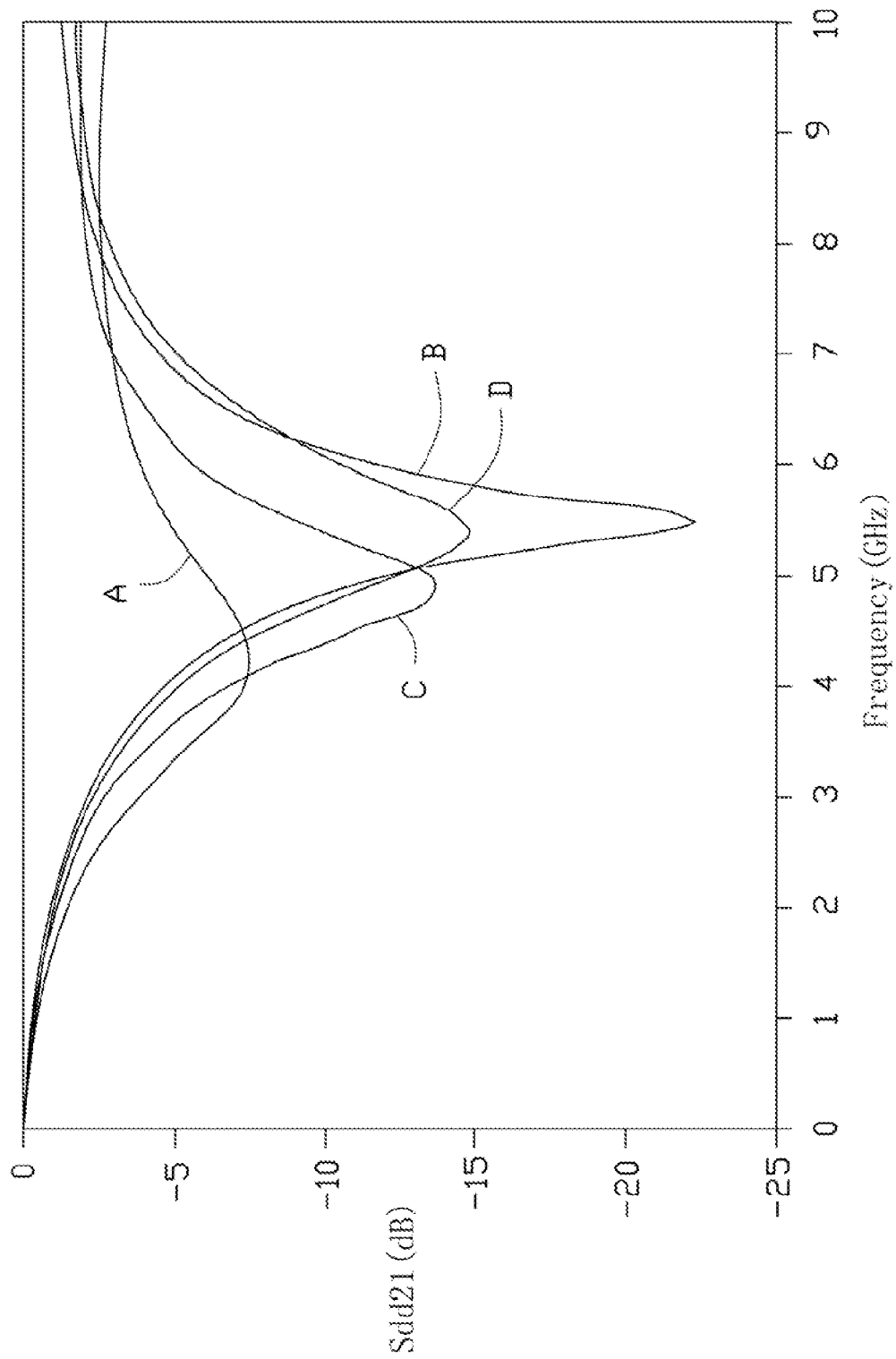
FIG. 4 is a simulation graph of insertion loss for the printed circuit boards of FIG. 1, FIG. 2, FIG. 3, and a conventional printed circuit board.

Referring to FIG. 4, a curve A denotes an insertion loss for the conventional printed circuit board. A curve B denotes an insertion loss for the printed circuit board 1. A curve C denotes an insertion loss for the printed circuit board 2. A curve D denotes an insertion loss for the printed circuit board 3. In FIG. 4, an x-coordinate denotes frequency of signals on the printed circuit boards, a y-coordinate denotes insertion loss of the printed circuit boards.

For FIG. 4, in general, insertion loss on the printed circuit boards 1, 2, and 3 are lower than the insertion loss on the conventional printed circuit board.

The foregoing description of the exemplary embodiments of the disclosure has been presented only for the purposes of illustration and description and is not intended to be exhaustive or to limit the disclosure to the precise forms disclosed. Many modifications and variations are possible in light of the above everything. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skills in the art to which the present disclosure pertains without departing from its spirit and scope. Accordingly, the scope of the present disclosure is defined by the appended claims rather than the foregoing description and the exemplary embodiments described therein.

What is claimed is:

1. A printed circuit board comprising:
   a first signal layer;
   a second signal layer;
   a third signal layer located between the first and second signal layers;
   a first ground layer located between the first and third signal layers;
   a second ground layer located between the second and third signal layers;
   a third ground layer located between the third signal layer and the second ground layer;
   a first transmission line located on the first signal layer;
   a second transmission line located on the third layer;
   a first via passes through the printed circuit board, and electronically coupled to the first and second transmission lines, wherein the first via is isolated from the first, second, and third ground layers; and
   a second via passes through the printed circuit board, wherein the second via is electronically coupled to the first and third ground layers, and isolated from the second ground layer.

2. The printed circuit board of claim 1, further comprising a third via electronic coupled with the first and third ground layers, wherein the third via passes through the printed circuit board, and is isolated from the second ground layer.

3. The printed circuit board of claim 2, wherein the second and third vias are located on different sides of the first via.

* * * * *